(12) United States Patent
Cheah

(10) Patent No.: US 6,243,291 B1
(45) Date of Patent: Jun. 5, 2001

(54) TWO-STAGE PIPELINE SENSING FOR PAGE MODE FLASH MEMORY

(75) Inventor: Ken C. Cheah, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,186

(22) Filed: Feb. 15, 2000

(51) Int. Cl.[7] .................................................. G11C 11/34
(52) U.S. Cl. ................................ 365/185.12; 365/230.04
(58) Field of Search ........................... 365/230.04, 185.12

(56) References Cited

U.S. PATENT DOCUMENTS 5,875,134 * 2/1999 Cloud ..................................... 365/193

OTHER PUBLICATIONS 3.0 Volt–only Page Mode Flash Memory Technology, Technology Background, AMD.

* cited by examiner

Primary Examiner—David Nelms
Assistant Examiner—M. Tran
(74) Attorney, Agent, or Firm—Brinks Hofer Gilson & Lione

(57) ABSTRACT

A method for operating a page mode memory device includes decoding an address defining a page for access and sensing first data on a first portion of the page. The first data is then produced at an output. Substantially simultaneously, second data is sensed on a second portion of the page and subsequently the second data is produced at the output. In this manner, the current drain and noise within the memory device are reduced to improve performance and reliability of the memory device.

14 Claims, 4 Drawing Sheets

US 6,243,291 B1

TWO-STAGE PIPELINE SENSING FOR PAGE MODE FLASH MEMORY

BACKGROUND OF THE INVENTION

The present invention relates generally to method and apparatus for sensing data in a memory device such as flash memory integrated circuit. More particularly, the present invention relates to a two-stage pipelined sensing technique for a page mode flash memory.

Memory integrated circuits provide storage and retrieval of data. There are several types of memory, including, generally, volatile and nonvolatile memory. Nonvolatile memory includes EPROM, EEPROM and flash memory technology. In general, an address is provided to the memory while data is read or stored at the location in the memory defined by the address. General design goals for all memory devices include large storage size, short access times for reading and writing of data, and minimized power dissipation.

One design technique to reduce read access time is page mode operation. In page mode, an entire page of data is simultaneously sensed internally to the memory. The address to the chip may then be changed to read individual words on the address page. In one example, four 16-bit words form a page. Sixty four bits are sensed and then read one word or sixteen bits at a time from the memory. Sensing such a large number of bits simultaneously can cause operational problems within the memory. The current drain due to the read current in the example mentioned is approximately 80 $\mu$A per bit. For sensing 64 bits, the total read current is 5.12 mA. This read current is a substantial component of the power dissipation for the entire chip. Switching this current can introduce transient voltages on the power and ground nodes of the chip. These transient voltages can introduce delay in the circuit performance and corrupted data. Accordingly, there is a need for an improved method and apparatus for sensing data in a page mode memory device.

BRIEF SUMMARY OF THE INVENTION

The present invention is directed to a method and apparatus for sensing data in a memory such as a page mode memory integrated circuit. One embodiment of the method includes pipelining data during the sensing process. During a first stage of the pipeline, two words of a four words page are sensed and latched. During a second stage of the pipeline, the next two words on the page are sensed while the first two words are produced at the output of the integrated circuit in response to a word address. Subsequently, the remaining two words are unlatched and produced at the output when the appropriate word addresses are received.

The foregoing description of the present invention has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
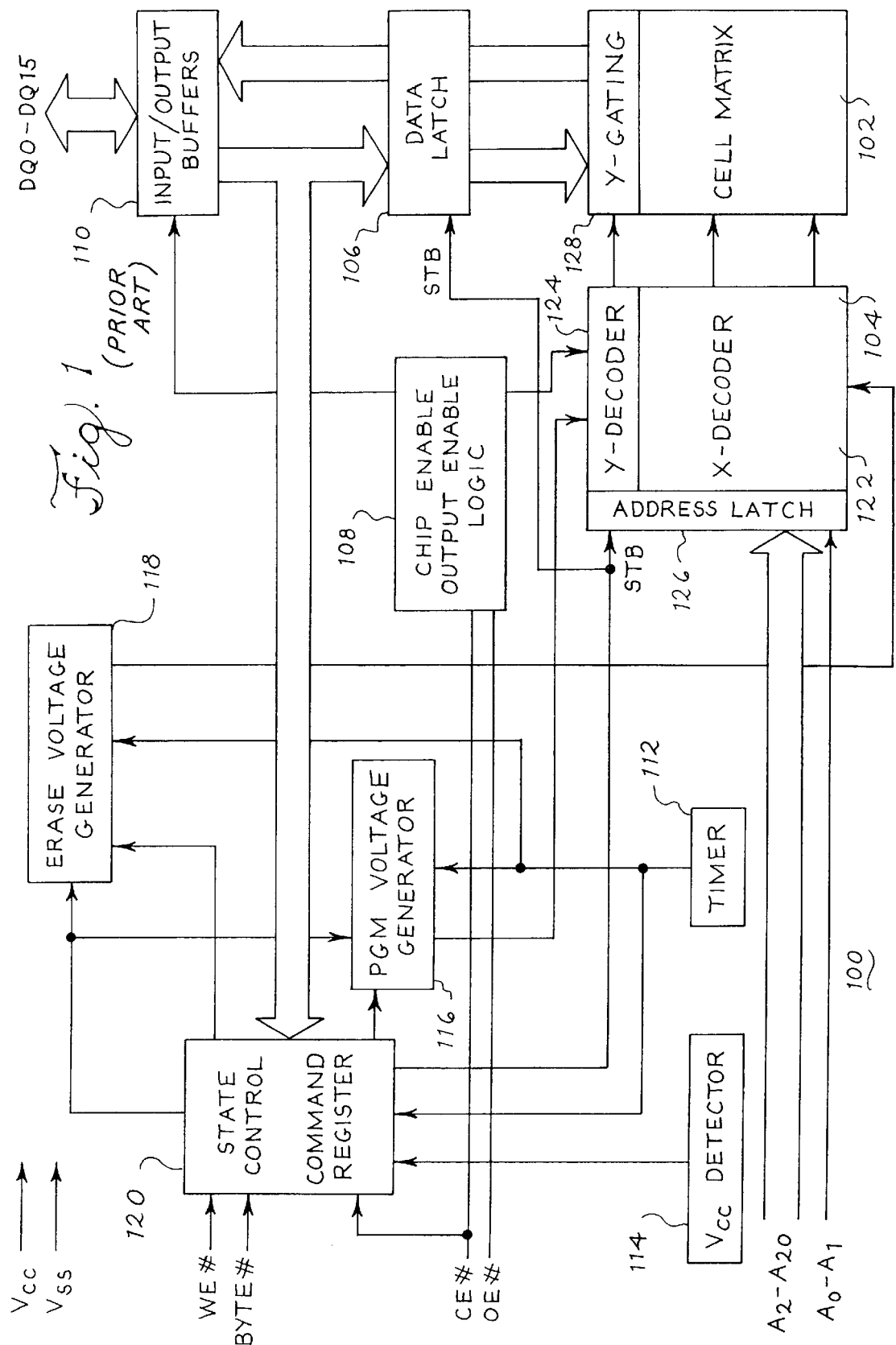
FIG. 1 is a block diagram of a prior art page mode flash memory device.

Referring now to the drawing, FIG. 1 is a block diagram of a prior art page mode flash memory device 100. The memory 100 includes a core cell array or matrix 102, addressing circuitry 104, a data latch 106, chip enable and output enable logic 108 and input/output buffers 110. The memory 100 further includes a timer 112, a $V_{cc}$ detector 114, a program voltage generator 116, an erase voltage generator 118 and a state control and command register 120. The memory device 100 is preferably embodied as a semiconductor integrated circuit or chip.

The core cell array 102 includes a plurality of core cells or memory cells. Each core cell is configured to store one or more bits of data. The core cells are arranged in an array of rows and columns, with each location being individually addressable using the addressing circuitry 104. The addressing circuitry 104 includes an X decoder 122, a Y decoder 124 and an address latch 126. The address latch 126 receives and stores an address signal designated $A_0$–$A_{20}$ in FIG. 1. This 21-bit address defines the desired location within the core cell array 102 for reading or writing data. The address signal is decoded by the X decoder 122 and Y decoder 124 to select one or more rows and one or more columns of the core cell array 102. Data communication between the core cell array 102 and the data latch 106 is controlled by a Y gating circuit 128, which is controlled in response to signals generated by the Y decoder 124.

The data latch 106 stores data to be written to the core cell array and data read from the core cell array 102. For writing data, a 16-bit data word is provided to the input/output buffers 110 and then latched into the data latch. Similarly, for reading data, data from the core cell array 122 is latched in the data latch 122 and presented to the input/output buffers 110 to be conveyed off chip to external circuitry.

The chip enable/output enable logic 108 controls the operation of the memory 100 as well as the input/output buffers 110. The chip enable/output enable logic 108 responds to two input signals received from external the memory 100. The chip enable signal, labeled CE# in FIG. 1, selects either an active mode or a low power, disabled mode for the memory 100. The output enable signal, labelled OE#, controls the direction of data flow in the input/output buffers 110.

The timer 112 generates timing signals for controlling the overall operation of the memory 100. The $V_{cc}$ detector 114 generates a signal indicating the presence of and level of a power supply voltage, $V_{cc}$. The memory 100 also receives ground potential, labeled $V_{ss}$ in FIG. 1. The program voltage generator 116 generates a voltage suitable for programming the core cells of the core cell array 102. Similarly, the erase voltage generator 118 generates a voltage suitable for erasing data stored in core cells of the core cell array 102. The state control and command register 120 controls the overall operation of the memory 100.

Figure 2:
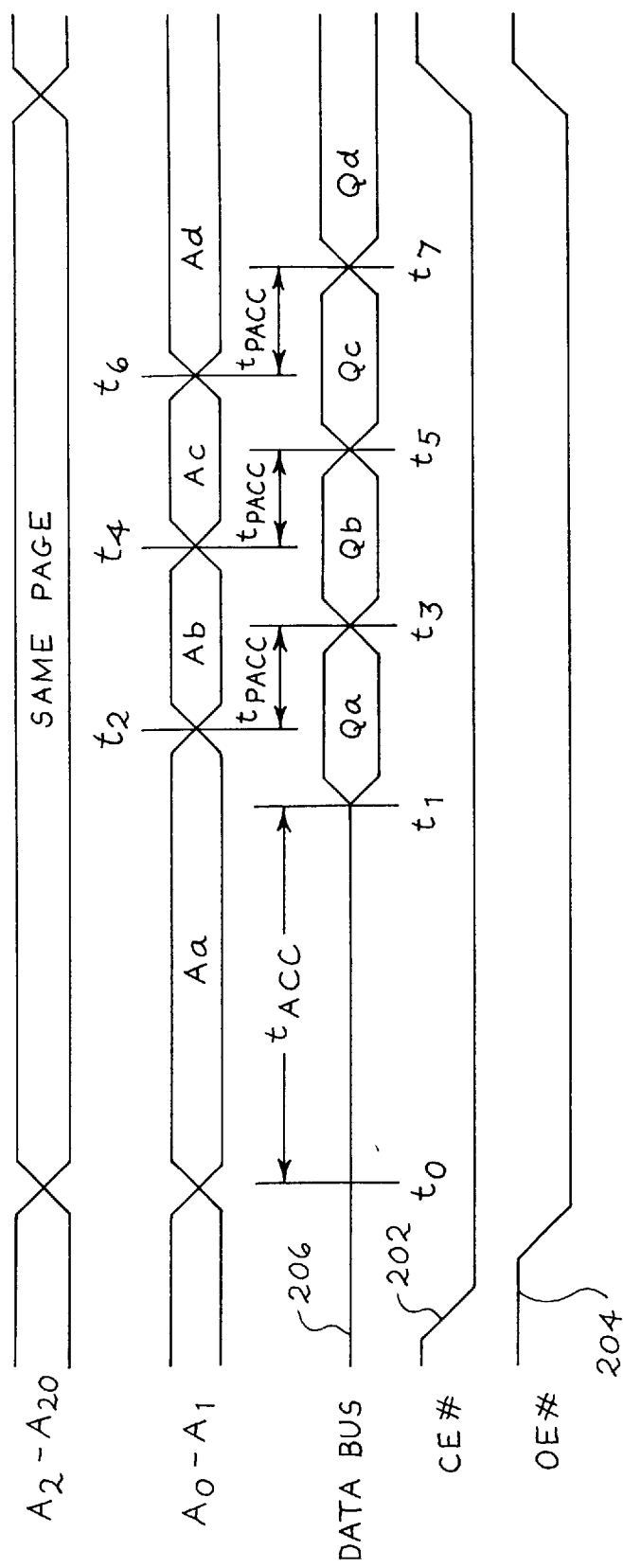
FIG. 2 is a timing diagram illustrating operation of the page mode memory device of FIG. 1.

FIG. 2 is a timing diagram illustrating operation of the memory 100 of FIG. 1. In particular, FIG. 2 illustrates input and output signals to the memory 100 during a page mode read operation. In a page mode read operation, an address is presented to the memory 100 to read an entire page of memory. The initial read operation takes the full address access time of the memory to complete. During this time, the page address is decoded to select the desired data, an entire page worth of data is sensed and latched, and one word is output while the remaining words of the page are retained in storage for subsequent reading. Subsequently, one or two of the bits of the address signal may be varied to read different words on the same page of the memory 100. Since the sensing operation has been completed, and the sensed data stored in the data latch 106, the subsequent operation to read words of the page takes a shorter amount of time, referred to as the page access time.

FIG. 2 illustrates a page access. In FIG. 2, initially the chip enable signal CE# 202 is driven to a logic low level to enable the memory 100. Subsequently, the output enable signal 204 is driven low to place the memory in a read mode, enabling the input/output buffers 110 (FIG. 1) for output operation. Next, the address signals are switched to select a page of memory. The address signals $A_{20}$–$A_2$ define the page address within the memory 100. The address signals $A_1$–$A_0$ define the word address of individual words on the page defined by the page address. The address signals are asserted at a time $t_0$ to select an address Aa. At time $t_1$, the data stored in the location addressed by the address signals asserted at $t_0$ is presented at the input/output buffers 110. Thus, the time $t_1$–$t_0$ corresponds to the address access time $t_{ACC}$ for the memory 100. During the access time, the address signals are decoded by the X decoder 122 and Y decoder 124 (FIG. 1). Also during the address access time, the state of the data stored at the access location is sensed and this data is conveyed to the data latch 106. After being received at the data latch 106, the data to be read is conveyed to the input/output buffers 110 at time $t_1$. The data bus 206 is driven to the logic levels corresponding to the first word, designated Qa in FIG. 2.

At a time $t_2$, the word address defined by address signals $A_0$ and $A_1$ is changed to select another word on the page defined by the page address $A_{20}$–$A_2$. This word address is designated Ab in FIG. 2. Subsequently, at $t_3$, the data bus 206 is driven to logic levels corresponding to the second data word, Qb. The difference between the time $t_3$ and time $t_2$ corresponds to the page access time, designated $t_{PACC}$.

At time $t_4$, the word address is changed again to designate a next word on the page, located at address Ac. At time $t_5$ the data bus 206 is driven to logic levels corresponding to the third word on the page, Qc. Again, the difference between time $t_5$ and time $t_4$ corresponds to the page access time. At time $t_6$, the word address $A_1$–$A_2$ is changed to designate the final word on the page, addressed at address Ad. At time $t_7$, the data bus 206 is driven to the logic levels corresponding to the final word on the page, Qd. Once again, the difference between time $t_7$ and $t_6$ corresponds to the page access time, $t_{PACC}$.

Figure 3:
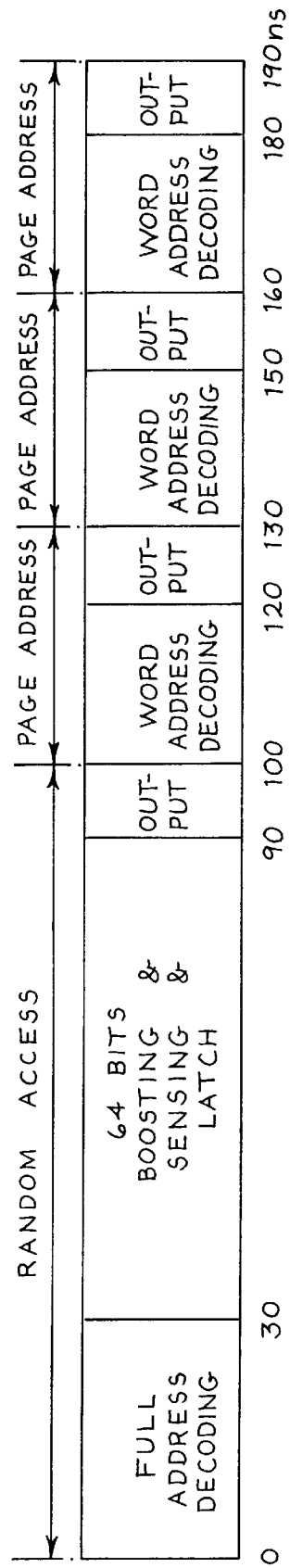
FIG. 3 is a timing diagram illustrating internal operation of the page mode memory device of FIG. 1.

The internal operation of the memory 100 is illustrated by the timing diagram of FIG. 3. In FIG. 3, the horizontal axis represents elapsed time in nanoseconds. Timing in FIG. 3 is exemplary only. The timing diagram begins with presentation of a page address to the memory, corresponding to time $t_0$ in FIG. 2.

During the first 30 nanoseconds of the timing diagram of FIG. 3, fill address decoding occurs. The 20 bits of the address presented to the memory 100 are decoded in the X decoder 122 and Y decoder 124 to select the data designated by this address. Since the memory is operated in page mode, 64 bits are selected for reading. From time=30 ns to time=90 ns, the 64 bits of data are sensed. In the embodiment of FIG. 3, sensing comprises operations of boosting, sensing and latching. Boosting involves increasing the voltage or current generated by a core cell at a selected address to reliably sense the data state stored at that core cell. Sensing involves the actual detection of the data state, for example by comparing the boosted signals with a threshold voltage or current in a sense amplifier. Latching involves storing the output of a sense amplifier in the data latch 106. Thus, at time=90 ns, the data is available at the data latch 106 for presentation external to the memory.

From time=90 ns to 100 ns, the randomly accessed data are presented at the outputs of the memory 100. The 16 bits associated with the first word address are conveyed from the data latch 106 to the input/output buffers 110 and provided external to the memory 100. At this point, the random access operation is ended.

At time=100 ns, a first page access begins. From time=100 ns to 120 ns, word address decoding occurs as the address signals change from the initial word address, Aa in FIG. 1, to the second word address Ab. At time 120 ns, the data selected by the new word address is conveyed from the data latch 106 to the input/output buffers 110 during the output operation. At time=130 ns the first page access ends and a second page access begins. During the second page access, for 20 ns after time=130 ns, the word address decoding occurs to select a third word, at address Ac. Following decode of this address, the data is conveyed from the data latch 106 to the input/output buffers 110 during the 10 ns following time=150 ns. At time=160 ns, the final page access begins as the page address changes to select the fourth word address, Ad. Again, word address decoding requires 20 ns and the data output process requires an additional 10 ns. At time t=190 ns all four words of the page have been output from the memory.

As can be seen in FIGS. 2 and 3, the page access time is much less than the address access time. The address access time is also referred to as the random access time. In one embodiment, the address access time is approximately 100 ns. The page access time is approximately 30 ns. Thus, page mode operation provides a significant operational performance improvement by reducing the access time required for words on the page other than the initial word.

However, this benefit is achieved only at the cost of substantial current drain within the memory 100. During the page access time, $t_{ACC}$, data bits for all words on the addressed page are sensed in the core cell array. Accessing and sensing data is a relatively high current operation, requiring 80 microamps per bit in one example. Accessing 64 bits simultaneously requires 5.12 milliamps total, which is a substantial current drain for the memory 100. Also, this large current drain can disrupt operation of the memory 100.

Figure 4:
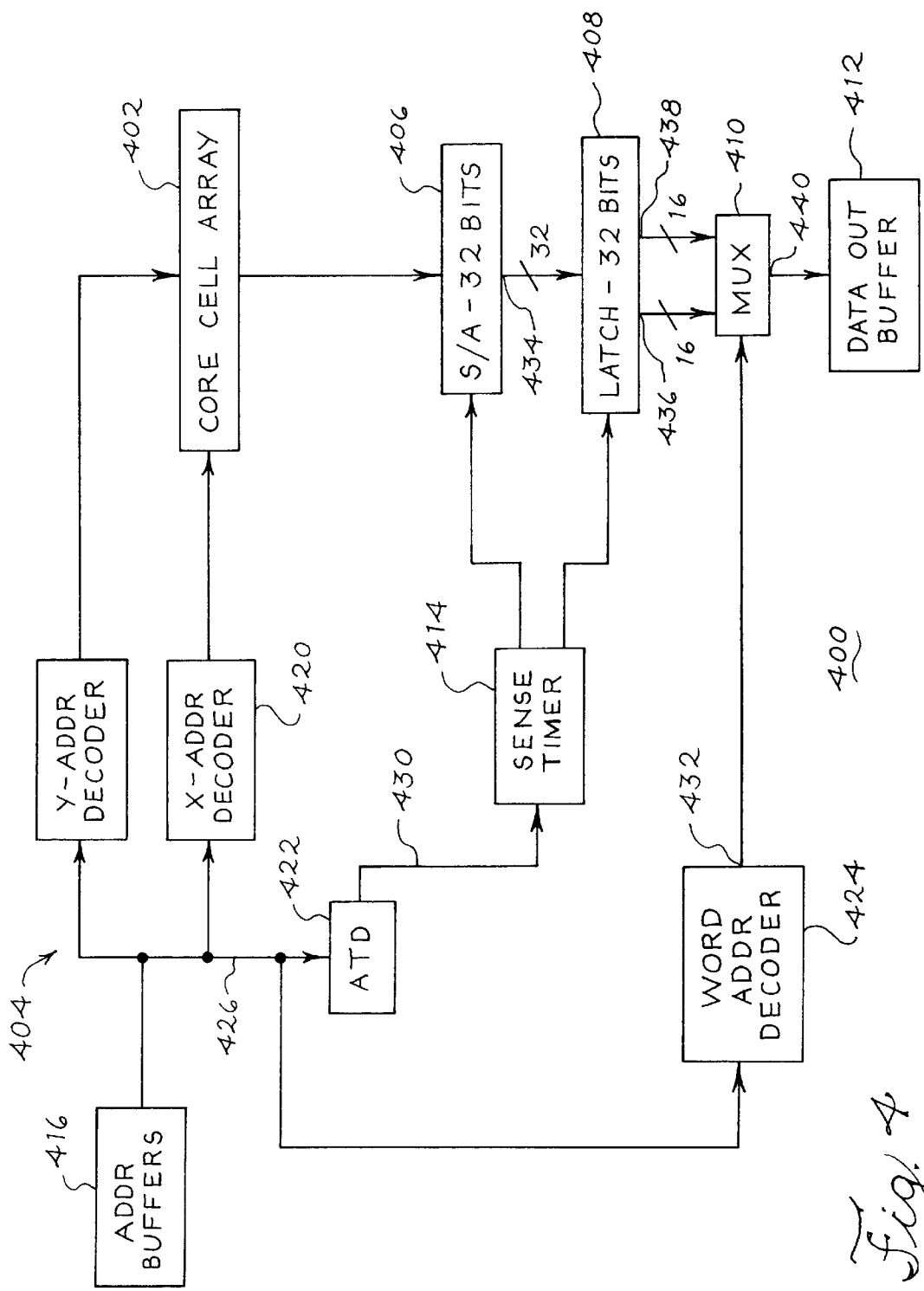
FIG. 4 is a block diagram of a page mode memory device.

FIG. 4 is a block diagram of a memory device 400 operable in page mode. The memory device 400 includes a core cell array 402, addressing circuitry 404, sense amplifiers 406, a latch 408, a multiplexer 410, a data output buffer 412 and a sense timer 414. The core cell array 402 includes a matrix or array of core cells, each core cell configured to store one or more bits of data. Each core cell may be independently addressed using the addressing circuitry 404.

The addressing circuitry 404 includes address buffers 416, a Y address decoder 418, an X address decoder 420, an address transition detection circuit 422 and a word address decode circuit 424. The address buffers 416 receive address signals from external to the memory device 400 and generate internal address signals on a bus 426. The signals are used by the X address decoder 420 and the Y address decoder 418 to select one or more rows and columns of the core cell array 402 for reading and writing data.

The address transition detection circuit 422 detects transitions on any of the address signals received at the address buffers 416. The address transition detection circuit 422 produces a pulse having a predetermined time duration at an output 430. Various types of ATD circuits have been developed and may be used to perform the function of the address transition detection circuit 422. The word address decode circuit 424 decodes the word address in response to the internal address signals on the bus 426. The word address may be defined by any combination of the address signals. The word address decoder 424 generates a control signal at an output 432.

The sense amplifier 406 detects the data state of core cells selected by address signals provided to the core cell array by the Y decoder 418 and the X decoder 420. For example, the selected core cells sink current when selected. The current has a first value when the stored data correspond to a logic one and a second value when the stored data corresponds to a logic 0. The sense amplifier 406 detects the value of the current and produces data at an output 434 corresponding to the detected data. The latch 408 receives the data sensed by the sense amplifiers 406 and stores the data. Any suitable type of data storage circuit may be used to perform the function provided by the latch 408.

In accordance with the present invention, the sense amplifiers 406 sense 32 bits from the core cell array at one time. Similarly, the latch 408 stores 32 bits sensed by the sense amplifiers. In this manner, the current drain due to sensing is reduced, from the 64 bits required in the prior art implementation of FIG. 1 to the current associated with 32 bits for the embodiment of FIG. 4.

The latch 408 has two 16 bit outputs 436, 438. After data from the core cell array 402 is sensed by the sense amplifier 406 and stored in the latch 408, the 32 bits of data is presented at the two 16-bit outputs 436, 438. The multiplexer 410 selects one of the 16-bit words at the outputs 436, 438 in response to a control signal received from the output 432 of the word address decoder 424. The multiplexer 410 has an output 440 for providing the selected word to the data out buffer 412.

The sense timer 414 generates timing signals to control the sense amplifier 406 and the latch 408. The sense timer responds to the address transition detection signal at the output 430 of the address transition detection circuit 422. The sense timer may be implemented in any suitable fashion, for example using a timing circuit and combinatorial logic to generate the necessary control signals for the sense amplifier 406 and the latch 408.

The method and apparatus are described herein in conjunction with a page mode flash memory. However, the same principles may be applied to other types of memory such as random access memory, as well.

In the illustrated embodiment, the sense amplifier 406 and the latch are time shared by the two stages of the pipeline operation. During a first stage, a first two words are sensed and latched. During a second stage, a second two words are sensed and latched. Time sharing in this manner reduces the area on an integrated circuit that must be devoted to these operations and reduces current drain as well. In other embodiments, however, there may be sense amplifiers dedicated to the first two words and separate sense amplifiers dedicated to the second two words. Similarly, in other embodiments, there may be a latch dedicated to the first two words and a latch dedicated to the second two words. Such an embodiment may provide advantages such as faster speed or reduced complexity.

Figure 5:
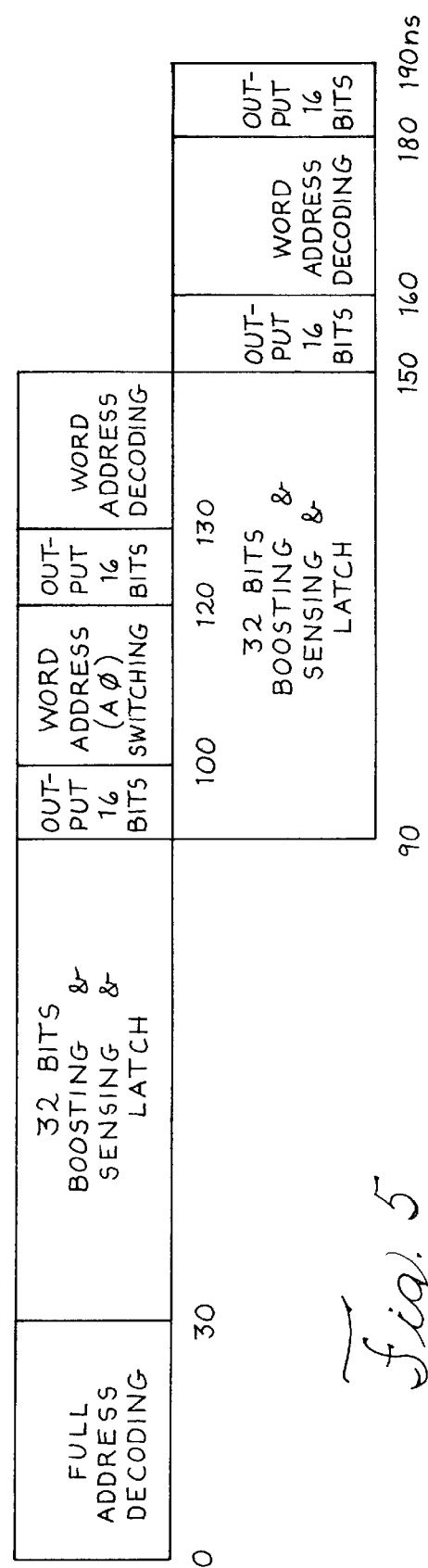
FIG. 5 is a timing diagram illustrating internal operation of the page mode memory device of FIG. 4.

FIG. 5 is a timing diagram illustrating operation of the flash memory device 400 of FIG. 4. In FIG. 5, relative time is illustrated along the horizontal axis. Time=0 ns corresponds with presentation of a page address to the address buffers 416 (FIG. 4). From time=0 ns to time=30 ns, address decoding occurs in the address circuitry 404. The Y address decoder 418 determines the appropriate Y address to be selected and the X address decoder 420 determines the appropriate X address to be decoded. Suitable signals are provided to the core cell array 402 to select the addressed data. In accordance with the present invention, on a page mode access, only two words or 32 bits are sensed at a given time. Thus, a two-stage pipeline is implemented.

In FIG. 5, from time=30 ns to time=90 ns, the first 32 bits or two words on the address page are sensed during the first stage of the pipeline. Sensing includes the process of boosting, sensing and latching data from the core cell array 402. Boosting involves detecting a voltage or current signal from the selected core cells of the core cell array 402 and amplifying the core cell signal to a signal which can be readily sensed. In one implementation, boosting is accomplished by a cascode circuit. Sensing involves comparing the boosted signal with a threshold voltage or current and making a decision based on the comparison about the data state stored in the addressed core cell. Latching involves conveying the sensed data from the sense amplifier 406 to the latch 408.

Thus, the sense timer 414 receives the address transition detection signal from the ATD circuit 422. The sense timer 414 times an appropriate time duration, then provides a control signal to the sense amplifier 406 to initiate the sensing operation. The time timed by the timer 414 may match the duration required for address decoding in the address circuitry 404, or any other appropriate time. After a suitable sensing time, the timer 414 generates another control signal for the latch 408. In response to the control signal, the latch 408 latches the data detected by the sense amplifier 406 and provided at the output 432.

As noted above, to reduce current drain and improve performance of the memory device 400, only 32 bits of a 64-bit page are sensed at a given time. A two-stage pipeline process is used to read the entire 64-bit page within the same 190 ns used by the prior art device, illustrated in FIG. 3. In FIG. 5, while the first two words (32 bits) are being output from the memory device 400, the second 32 bits are being sensed.

Thus, at time=90 seconds, a first 16-bit word is output from the memory device 400. During this time, corresponding to time $t_1$ to time $t_3$ in FIG. 2, the word address decoder 424 generates a control signal at the output 432 based on the word address currently selected. The word address may be defined by any of the address bits received by the address buffers 416. However, in one implementation, the word address will be defined by the one or two least significant bits of the address at the address buffer 416.

The control signal at the output 432 controls the multiplexer 410. In response to the control signal, the multiplexer 410 selects one of the two outputs 436, 438 of the latch 408. The data from the selected output 436, 438 is provided to the output 440 of the multiplexer 410 and, from there, to the data buffer 412 for presentation to electrical circuitry external to the memory device 400. Thus, from time=90 ns to time=100 ns, a first word on the address page is provided to the output of the memory device 400.

During time=100 ns to time=120 ns, the word address is switched to select a different word on the page. In the illustrated embodiment, the least significant bit $A_0$ of the input address is switched to select the word address. In response to this address change, the word address decoder 424 changes the state of the data at the output 432 of the word address decoder 424. This change of data state causes the multiplexer 410 to select the other output 436, 438 for conveying the 16-bit word latched in a latch 408 to the data in buffer 412. From time=120 ns to 130 ns, the sensed and latched data are conveyed to the data output buffer 412 and provided to external circuitry.

From time=130 ns to 150 ns, word address decoding again occurs. The word address decoder 424 detects the state of the word address and generates an appropriate signal at the output 432. Thus, the multiplexer 410 has already received an appropriate control signal to select the next word when that word is latched in the latch 408.

Meanwhile, from time=90 ns to time=150 ns, the second two words or 32 bits of the page are being sensed by the sense amplifiers. The sense timer 414 detects an address transition signal and produces a control signal to cause the sense amplifier 406 to begin the sensing operation. Again, sensing involves boosting the core cell current or voltage signal to an appropriate level, sensing the data state of the core cells and latching the sensed data in the latch 408. After the timer 414 times out, it generates another control signal to cause the latch 408 to latch the data produced at the output 434. At a time=150 ns, the sensed data have been latched in the latch 408 and, since the multiplexer 410 has already received the control signal from the output 432 to select the appropriate word, from time=150 ns to 160 ns, the data is conveyed by the multiplexer 410 from the latch 408 to the data out buffer 412 for use by external circuitry.

At time=160 ns, word address decoding for the final word on the page begins. The word address decoder 424 responds to the word address, for example by reading the state of the least significant bit of the input address, to generate a control signal at the output 432. In response to the control signal, the multiplexer 410 selects the appropriate word from the outputs 436, 438 of the latch 408. From time=180 ns, to 190 ns, the multiplexer 410 provides the data from the outputs 436,438 to the data buffer 412 and to the external circuitry.

From the foregoing, it can be seen that the present embodiments provide an improved method and apparatus for sensing in a page mode memory. In the same 190 ns that the prior art device of FIG. 1 required to produce four words in page mode operation, the method and apparatus according to the present invention have achieved the same result. However, whereas the previous embodiment of FIG. 1 sensed 64 bits at a time, causing substantial current drain and noise on power and ground buses, the present invention of FIG. 4 senses just 32 bits at a time. The current drain is substantially reduced by spreading the current drain all over a first stage and a second stage of a pipeline. This reduces the noise introduced to the power and ground nodes of the memory device 400. This in turn, improves the reliability and performance of the memory device.

While a particular embodiment of the present invention has been shown and described, modifications may be made. For example, in the embodiment of FIG. 4, the sense amplifier, latch and multiplexer are shown as discrete elements. It may be preferable to combine these elements into a single unified logic block in order to reduce the real estate required on the surface of the integrated circuit embodying the memory device 400, to reduce current drain, or to provide other benefits. It is therefore intended in the appended claims to cover all such changes and modifications which fall within the truth spirit and scope of the invention.

What is claimed is:

1. A method for operating a page mode memory device, the method comprising:
   decoding an address defining a page for access;
   sensing first data on a first portion of the page;
   producing at an output the first data from the first portion of the page;
   substantially simultaneously, sensing second data on a second portion of the page; and
   subsequently, producing at the output the second data from the second portion of the page.

2. The method of claim 1 wherein sensing first data comprises:
   sensing a first data word and a second data word located on the page defined by the address.

3. The method of claim 2 wherein producing at an output the first data comprises:
   producing the first data word at the output;
   decoding a second word address on the page corresponding to the second word; and
   producing the second data word at the output.

4. The method of claim 3 further comprising:
   decoding a third word address corresponding to a third word on the page.

5. The method of claim 4 wherein sensing second data comprises:
   sensing the third data word and a fourth data word located on the page defined by the address; and
   producing the third data word at the output.

6. The method of claim 2 further comprising:
   latching the first data word and the second data word.

7. The method of claim 6 further comprising:
   after latching the first data word and the second data word, sensing a third data word and a fourth data word located on the second portion of the page.

8. The method of claim 6 further comprising:
   decoding a word address; and
   selecting one of the first data word and the second data word in response to the word address.

9. The method of claim 1 wherein decoding the address comprises:
   decoding a word address corresponding to one word of a plurality of words on the page; and
   selecting a word for output in response to the word address.

10. A page mode memory comprising:
   a core cell array;
   address circuitry configured to decode input address signals and produce a page address and a plurality of word addresses within the page address in the core cell array;
   a sense amplifier circuit coupled to the core cell array and configured to sense data at a subset of the plurality of word addresses;
   a latch coupled to the sense amplifier circuit for storing data at current word addresses while the sense amplifier senses data at a next word address; and
   a switch circuit responsive to a current word address for selecting a current data word for output from the page mode memory.

11. The page mode memory of claim 10 further comprising:
   a sense timer configured to produce timing signals to control sensing by the sense amplifier circuit and latching by the latch.

12. A page mode memory access method comprising:

receiving an address defining a page address and a word address;

decoding the page address to select an addressed page including a plurality of data words;

during a first time period, sensing a first subset of data words of the plurality of data words;

during a second time period,
   producing at an output data words of the first subset of data words in response to the word address, and
   sensing a second subset of data words of the plurality of data words; and during a third time period, producing at the output data words of the second subset of data words in response to the word address.

13. The page mode memory access method of claim 12 further comprising:

during the second time period,
   producing a first word at the output in response to a first word address;
   receiving a second word address; and
   producing a second word at the output in response to the second word address.

14. The page mode memory access method of claim 13 further comprising:

latching the first word and the second word while sensing the second subset of data words.

* * * * *